United States Patent
Lee et al.

(10) Patent No.: US 8,709,932 B2
(45) Date of Patent: Apr. 29, 2014

(54) INTEGRATED CIRCUIT PACKAGING SYSTEM WITH INTERCONNECTS AND METHOD OF MANUFACTURE THEREOF

(75) Inventors: Soo Won Lee, Nam-si (KR); JiHoon Oh, Suwon (KR); Sung Jun Yoon, Icheon-si (KR)

(73) Assignee: Stats Chippac Ltd., Singapore (SG)

( * ) Notice: Subject to any disclaimer, the term of this patent is extended or adjusted under 35 U.S.C. 154(b) by 51 days.

(21) Appl. No.: 12/966,071

(22) Filed: Dec. 13, 2010

(65) Prior Publication Data
US 2012/0146230 A1  Jun. 14, 2012

(51) Int. Cl.
*H01L 21/44* (2006.01)
*H01L 21/00* (2006.01)
*H01L 23/02* (2006.01)

(52) U.S. Cl.
USPC ..... 438/612; 438/106; 257/686; 257/E21.508

(58) Field of Classification Search
USPC ........... 257/773, E21.499, E23.07, 676, 686, 257/711, E33.057, E23.061, E23.188, 257/E21.511, E21.508; 438/121, 106, 108, 438/109, 612, 613
See application file for complete search history.

(56) References Cited

U.S. PATENT DOCUMENTS

| | | | |
|---|---|---|---|
| 5,943,597 A | 8/1999 | Kleffner et al. | |
| 7,180,181 B2 | 2/2007 | Liu et al. | |
| 7,315,085 B2 | 1/2008 | Liu | |
| 7,419,850 B2 | 9/2008 | Chen et al. | |
| 7,473,629 B2 | 1/2009 | Tai et al. | |
| 7,569,164 B2 | 8/2009 | Sakurai et al. | |
| 2005/0082680 A1* | 4/2005 | Liu et al. | 257/777 |
| 2006/0051952 A1* | 3/2006 | Hsu et al. | 438/613 |
| 2006/0220246 A1 | 10/2006 | Kim et al. | |
| 2006/0225917 A1* | 10/2006 | Hu | 174/257 |
| 2008/0251942 A1* | 10/2008 | Ohuchi et al. | 257/778 |
| 2009/0243080 A1* | 10/2009 | Pendse et al. | 257/692 |
| 2009/0314538 A1* | 12/2009 | Jomaa et al. | 174/267 |

* cited by examiner

*Primary Examiner* — Daniel Luke
*Assistant Examiner* — Khaja Ahmad
(74) *Attorney, Agent, or Firm* — Ishimaru & Associates LLP (57) ABSTRACT

A method of manufacture of an integrated circuit packaging system includes: providing a carrier having a contact pad; forming a first resist layer, having a first resist opening, over the carrier and the contact pad, the first resist opening partially exposing the first contact pad; forming a second resist layer, having a second resist opening over the first resist opening, the second resist opening partially exposing the first resist layer; mounting an integrated circuit over the carrier; and forming an internal interconnect between the integrated circuit and the carrier, the internal interconnect filling the second resist opening with no space between the second resist layer in the second resist opening.

20 Claims, 4 Drawing Sheets

INTEGRATED CIRCUIT PACKAGING SYSTEM WITH INTERCONNECTS AND METHOD OF MANUFACTURE THEREOF

TECHNICAL FIELD

The present invention relates generally to an integrated circuit packaging system, and more particularly to a system for an integrated circuit packaging system with interconnects.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made using the semiconductor package structures. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package-on-package (POP). POP designs face reliability challenges and higher cost.

Thus, a need still remains for an integrated circuit system improved yield, low profile, and improved reliability. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a carrier having a contact pad; forming a first resist layer, having a first resist opening, over the carrier and the contact pad, the first resist opening partially exposing the first contact pad; forming a second resist layer, having a second resist opening over the first resist opening, the second resist opening partially exposing the first resist layer; mounting an integrated circuit over the carrier; and forming an internal interconnect between the integrated circuit and the carrier, the internal interconnect filling the second resist opening with no space between the second resist layer in the second resist opening.

The present invention provides an integrated circuit packaging system, including: a carrier having a contact pad; a first resist layer, having a first resist opening, over the carrier and the contact pad, the first resist opening partially exposing the first contact pad; a second resist layer, having a second resist opening, over the first resist layer, the second resist opening partially exposing the first resist layer; an integrated circuit mounted over the carrier; and an internal interconnect between the integrated circuit and the carrier, the internal interconnect filling the second resist opening with no space between the second resist layer in the second resist opening.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

Figure 1:
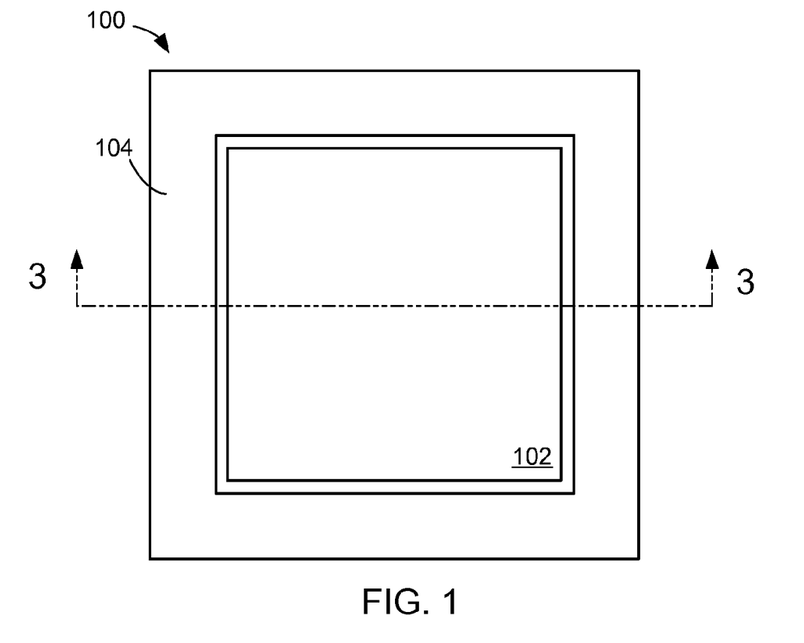
FIG. 1 is a top view of an integrated circuit packaging system in an embodiment of the present invention.

Referring now to FIG. 1, therein is shown a top view of an integrated circuit packaging system 100 in an embodiment of the present invention. The top view depicts an integrated circuit 102, which is a semiconductor device with active circuitry fabricated thereon, mounted over a carrier 104, which is a structure capable of supporting other conductive structures. As an example, the integrated circuit 102 can be a flip chip or an integrated circuit die. As a further example, the carrier 104 can be a laminated substrate made from bismaleimide triazine, a ceramic substrate, or a conductive substrate.

Figure 2:
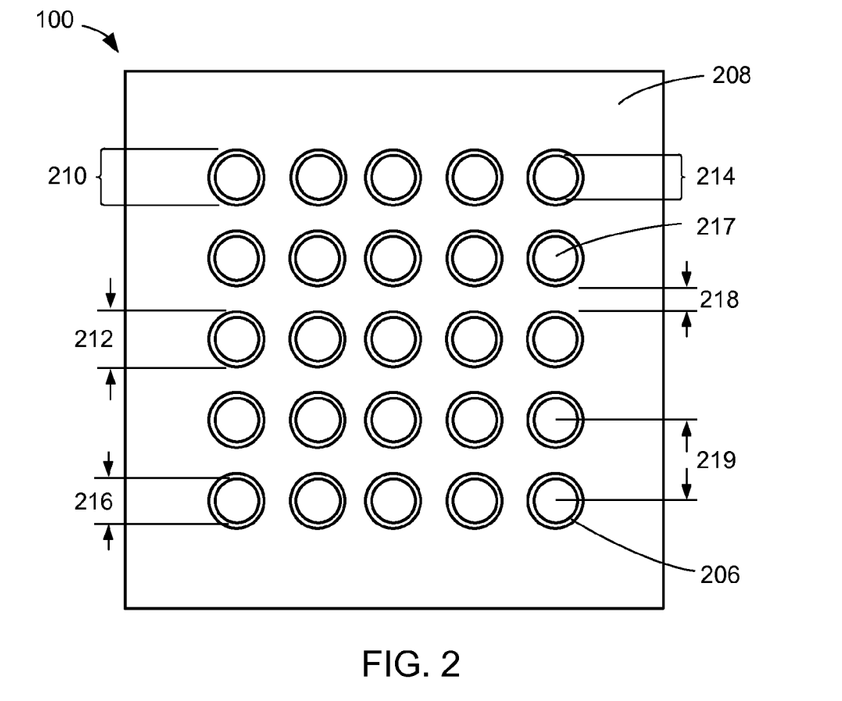
FIG. 2 is a top plan view of the integrated circuit packaging system without the integrated circuit of FIG. 1.

Referring now to FIG. 2, therein is shown a top plan view of the integrated circuit packaging system 100 without the integrated circuit 102 of FIG. 1. The top plan view depicts a first resist layer 206 and a second resist layer 208 over the substrate of FIG. 1. The first resist layer 206 and the second resist layer 208 are layers or coatings to protect against shorting of electrical components. As an example, the first resist layer 206 and the second resist layer 208 can be made out of a non-conductive material, such as a resin or polymer material.

The second resist layer 208 can have a second resist opening 210. As an example, the second resist opening 210 have a circular geometric shape.

The second resist opening 210 can have a second opening dimension 212. The second opening dimension 212 can be measured as a diameter of the second resist opening 210. As a specific example, the second opening dimension 212 can be 86 micrometers or less.

The second resist opening 210 can expose a portion of the first resist layer 206. The first resist layer 206 can have a first resist opening 214. As an example, the first resist opening 214 can be a circular geometric shape. The first resist opening 214 can be concentric with the second resist opening 210.

The first resist opening 214 can have a first opening dimension 216. The first opening dimension 216 can be measured as a diameter of the first resist opening 214. As a specific example, the first opening dimension 216 can be 66 micrometers or less. The first opening dimension 216 is less than the second opening dimension 212. As a further example, equation 1 can represent the preferred range of the first opening dimension 216 and the second dimension opening 212 where $d_{fo}$ and $d_{so}$ represent the first opening dimension 216 and the second dimension opening 212, respectively.

$$d_{fo} \leq 60 \text{ μm to } 80 \text{ μm} \leq d_{so} \tag{1}$$

The first resist opening 214 can expose a portion of a contact pad 217, which is a pad for electrical connection to the carrier 104. As an example, the contact pad 217 can be made of conductive materials, such as gold, gold alloys, silver, silver alloys, nickel-palladium alloys, copper, copper alloys, or other alloys.

For illustrative purposes, the integrated circuit packaging system 100 is shown with the first resist opening 214 and the second resist opening 210 as a circular geometric shape, although it is understood that the first resist opening 214 and the second resist opening 210 can have a different geometric shape. For example, the first resist opening 214 and the second resist opening 210 can have a square, triangular, octagonal or any other geometric shape.

For further illustrative purposes, the integrated circuit packaging system 100 is shown with the first resist opening 214 and the second resist opening 210 in an array configuration, although it is understood that the first resist opening 214 and the second resist opening 210 can be arranged in a different configuration. For example, the first resist opening 214 and the second resist opening 210 can be in a staggered configuration.

The integrated circuit packaging system 100 can have an edge distance 218. The edge distance 218 is the distance between the edge of one of the second resist opening 210 and another of the second resist opening 210. Equation 2 represents the preferred range of the edge distance 218 where a variable $d_e$ represents the edge distance 218. As a specific example, the edge distance 218 can be 64 micrometers.

$$30 \text{ μm} \leq d_e \leq 80 \text{ μm} \tag{2}$$

The integrated circuit packaging system 100 can have a pitch 219. The pitch 219 is the distance between the center of one of the first resist opening 214 and the center of another of the first resist opening 214. Equation 3 represents the preferred range of the pitch 219 where a variable $d_p$ represents the pitch 219. As a specific example, the pitch 219 can be 150 micrometers.

$$130 \text{ μm} \leq d_p \leq 180 \text{ μm} \tag{3}$$

Figure 3:
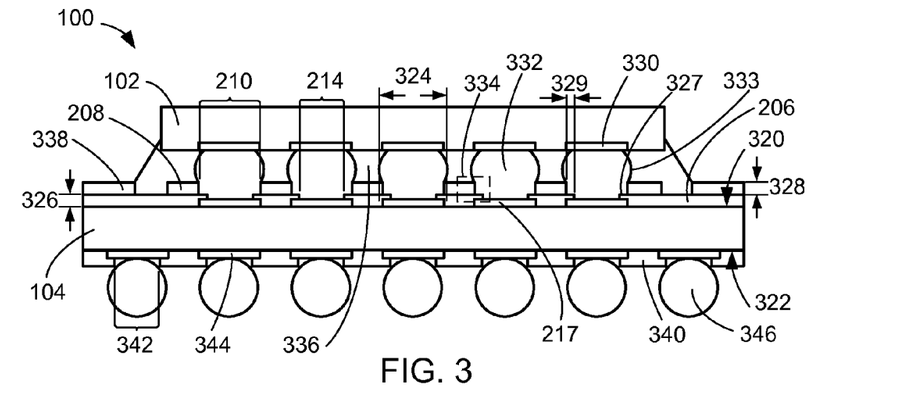
FIG. 3 is a cross-sectional view of the integrated circuit packaging system along line 3-3 of FIG. 1.

Referring now to FIG. 3, therein is shown a cross-sectional view of the integrated circuit packaging system 100 along line 3-3 of FIG. 1. The cross-sectional view depicts the carrier 104 having a carrier first side 320 and a carrier second side 322. The contact pad 217 can be along the carrier first side 320.

The contact pad 217 can have a contact width 324. Equation 4 represents the preferred range of the contact width 324 where a variable $d_c$ represents the contact width 324. As a specific example, the contact width 324 can be 100 micrometers.

$$60 \text{ μm} \leq d_c \leq 100 \text{ μm} \tag{4}$$

The first resist layer 206 can be over the carrier first side 320 and the contact pad 217. The first resist layer 206 can have the first resist opening 214. A portion of contact pad 217 can be exposed from the first resist opening 214.

The first resist layer 206 can have a first resist thickness 326. Equation 5 represents the preferred range of the first resist thickness 326 where a variable $d_{ft}$ represents the first resist thickness 326. As a specific example, the first resist thickness can be 10 micrometers.

$$5 \text{ μm} \leq d_{ft} \leq 10 \text{ μm} \tag{5}$$

The second resist layer 208 can be over the first resist layer 206. The second resist layer 208 can have the second resist opening 210. The second resist opening 210 can be over the first resist opening 214.

The second resist opening 210 can expose a first resist step 327, which is the portion of the first resist layer 206 that is over the contact pad 217. The first resist step 327 can have a step width 329, which is measured as a distance from the edge of the first resist layer 206 at the first resist opening 214 to the edge of the second resist layer 208 at the second resist opening 210 and along the top surface of the first resist layer 327. As a specific example, the step width 329 can be about 10 μm.

The second resist layer 208 can have a second resist thickness 328. Equation 6 represents the preferred range of the first resist thickness 326 where a variable $d_{srt}$ represents the first resist thickness 326.

$$5\ \mu m \leq d_{srt} \leq 10\ \mu m \qquad (6)$$

As specific example, the second resist thickness 328 can be equivalent to the first resist thickness 326. Equivalent means that the second resist thickness 328 and the first resist thickness 326 are the same. As a specific example, both the first resist thickness 326 and the second resist thickness 328 can be 10 micrometers.

The integrated circuit packaging system 100 can have a thickness ratio. The thickness ratio can be the ratio of the first resist thickness 326 to the second resist thickness 328. As an example, the thickness ratio can be one to one, although it is understood that the thickness ratio can vary to accommodate the needs of the manufacturer.

The integrated circuit 102 can be mounted over the carrier 104. The integrated circuit 102 can have a mounting pad 330, which is a pad for electrical connection to the integrated circuit 102, along the side of the integrated circuit 102 facing the carrier 104. As an example, the mounting pad 330 can be made of conductive material, such as gold, gold alloy, silver, silver alloy, copper, copper alloy, or other alloys.

The integrated circuit 102 can be connected to the carrier 104 with an internal interconnect 332, which is a conductive material that provides electrical interconnection. As an example, the internal interconnect 332 can be a solder ball, a solder bump, or a conductive bump. The internal interconnect 332 can connect between the mounting pad 330 of the integrated circuit 102 and the contact pad 217 of the carrier 104.

The first resist opening 214 and the second resist opening 210 can form a stair structure 334 as depicted by the dashed square. The portion of the first resist layer 206 that is exposed from the second resist opening 210 forms a first step and a top surface of the second resist layer 208 forms a second step. The stair structure 334 can provide increased surface area for contact between the internal interconnect 332 and the first resist layer 206.

The internal interconnect 332 can cover the exposed portion of the contact pad 217. The internal interconnect 332 can completely fill the first resist opening 214 and can be in full contact with the entire horizontal side of the first resist opening 214. The internal interconnect 332 can fill the first resist opening 214 with no space between the first resist layer 206 in the first resist opening 214. The internal interconnect 332 can completely cover the exposed portion of the first resist layer 206.

The internal interconnect 332 can fill the second resist opening 210 and can be in full contact with the entire horizontal side of the second resist opening 210. The internal interconnect 332 can fill the second resist opening 210 with no space between the second resist layer 208 in the second resist opening 210. The internal interconnect 332 can form a bulge 333 over a portion of the second resist layer 208 adjacent to the second resist opening 210.

An underfill 336, which is a non-conductive material that can protect components and have adhesive properties, can be around the internal interconnect 332. As an example, the underfill can be an adhesive material, such as an epoxy or other resin. The underfill 336 can be between the second resist layer 208 and the side of the integrated circuit 102 facing the carrier 104. A portion of the underfill 336 below the integrated circuit 102 covers the second resist layer 208 without contacting the first resist layer 206.

A dam 338, which is a structure to capture or receive excess of the underfill 336, can adjacent to the second resist opening 210. The dam 338 can be a groove or a trench formed in the second resist layer 208. The dam 338 can expose a portion of the first resist layer 206.

A third resist layer 340, which is a layer or coating to protect against shorting of electrical components, can be over a carrier second side 322. As an example, the third resist layer 340 can be made out of a non-conductive material, such as a resin, polymer material, or a material similar to that used to form the first resist layer 206 and the second resist layer 208. The carrier second side 322 is the side of the carrier 104 facing away from the integrated circuit 102.

The third resist layer 340 can have a third resist opening 342. The third resist opening 342 can expose a portion of an external connect pad 344, which is a pad for electrical connection to the carrier 104. As an example, the external connect pad 344 can be made out of conductive materials, such as gold, gold alloys, silver, silver alloys, nickel-palladium alloys, copper, copper alloys, or other alloys. The external connect pad 344 can be along the carrier second side 322.

An external interconnect 346, which is an electrical connector, can be connected to the external connect pad 344. As an example, the external interconnect 346 can be a solder ball, solder bump, or a connective bump. The external interconnect 346 can be used for connection to the next system level (not shown).

It has been discovered that the present invention provides the integrated circuit packaging system 100 having improved connectivity and reliability. The first resist layer 206 exposed from the second resist opening 210 form the stair structure 334 which provides increased surface area for connection and wet-out of the internal interconnect 332 during a reflow process. The increased surface area for connection and wet-out of the internal interconnect 332 can reduce or eliminate the risk of non-wetting with the exposed portion of the contact pad 217 and the first resist layer 206 and enables robust joint formation between the contact pad 217 and the internal interconnect 332, thereby improving connectivity and reliability of the integrated circuit packaging system 100.

It has also been discovered that the present invention provides the integrated circuit packaging system 100 with improved performance and yield. The second resist layer 208 and the second resist opening 210 form a dam which can reduce or eliminate the risk of bridging between one of the internal interconnect 332 with another of the internal interconnect 332 during a reflow process, thereby improving performance and yield of the integrated circuit packaging system 100.

It has been further discovered that the present invention provides the integrated circuit packaging system 100 with increased connectivity. The stair structure 334 provides an increased wet-able area for bonding the internal interconnect 332, which enables manufactures to reduce the size of the first resist opening 214. Reducing the size of the first resist opening 214 can enable a reduction in the contact width 324 of the contact pad 217. The reduction in the contact width 324 can increase the numbers of the contact pad 217 per unit area, thus increasing the connectivity of the integrated circuit packaging system 100.

It has been yet further discovered that the present invention provides the integrated circuit packaging system 100 with reduced delamination between the first resist layer 206 and the second resist layer 208. The stair structure 334 provides an increased wet-able area for bonding the internal interconnect 332, which enables manufactures to reduce the size of the first resist opening 214 and the second resist opening 210. Reduction in size of the first resist opening 214 and the second resist opening 210 increases the overall surface area of the second resist layer 208 for bonding to the first resist layer 206, thus reducing the risk of delamination.

It has been yet further discovered that the present invention provides the integrated circuit packaging system 100 with improved formation of the underfill 336. The internal interconnect 332 sized to fill the first resist opening 214 and the second resist opening 210 can reduce void and gap formation within the first resist opening 214 and the second resist opening 210 by 50%. The absence of voids and gaps improves the flow of the underfill 336 over the second resist layer 208 and around the internal interconnect 332, which provides improved formation of the underfill 336.

Figure 4:
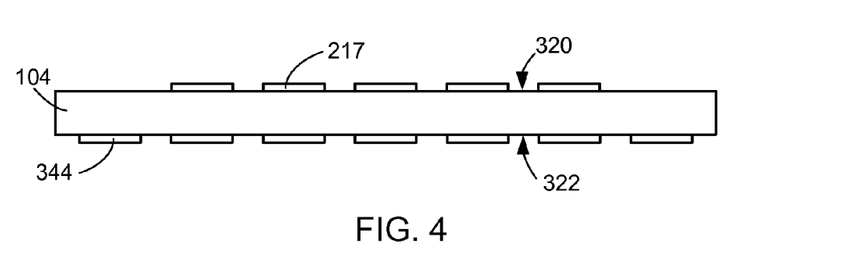
FIG. 4 is a cross-sectional view of the carrier in a manufacturing phase.

Referring now to FIG. 4, therein is shown a cross-sectional view of the carrier 104 in a manufacturing phase. The contact pad 217 can be exposed along the carrier first side 320 of the carrier 104. The external connect pad 344 can be exposed along the carrier second side 322 of the carrier 104.

Figure 5:
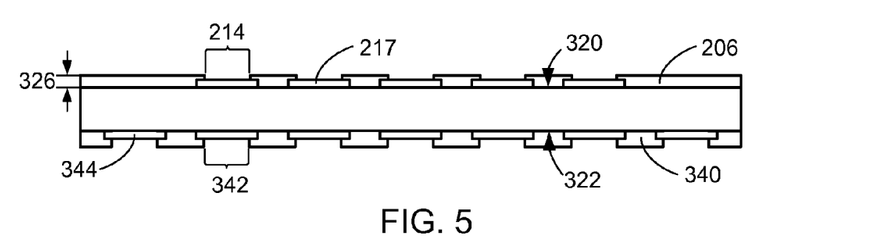
FIG. 5 is the structure of FIG. 4 in forming the first resist layer.

Referring now to FIG. 5, therein is shown the structure of FIG. 4 in forming the first resist layer 206. The first resist layer 206 can be formed over the carrier first side 320. The first resist layer 206 can be formed over the contact pad 217 with the first resist opening 214 exposing a portion of the contact pad 217. The first resist layer 206 can be formed to have the first resist thickness 326.

The third resist layer 340 can be formed along the carrier second side 322. The third resist layer 340 can be formed over the external connect pad 344 with the third resist opening 342 exposing a portion of the external connect pad 344.

The first resist layer 206 and the third resist layer 340 can be formed in a number of different ways. For example, the first resist layer 206 and the third resist layer 340 can be formed by a process such as chemical vapor deposition or a screen printing process.

Figure 6:
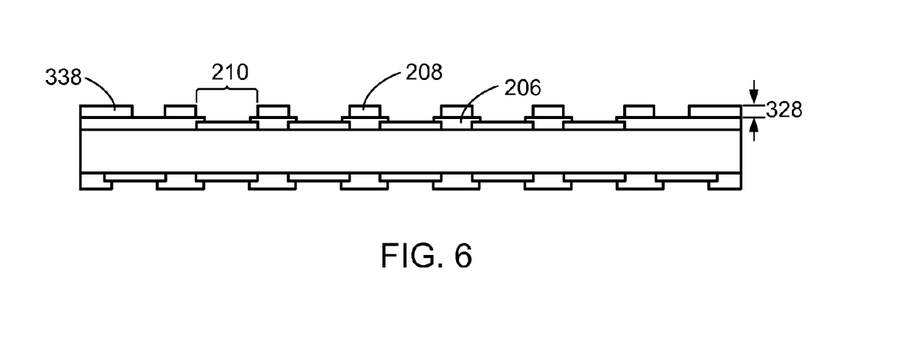
FIG. 6 is the structure of FIG. 5 in forming the second resist layer.

Referring now to FIG. 6, therein is shown the structure of FIG. 5 in forming the second resist layer 208. The second resist layer 208 can be formed over the first resist layer 206 with the second resist opening 210 exposing a portion of the first resist layer 206.

The second resist layer 208 can be formed to have the second resist thickness 328. As an example, the second resist thickness 328 can be equivalent to the first resist thickness 326 of FIG. 5.

The dam 338 can be formed in the second resist layer 208 can expose a portion of the first resist layer 206. The dam 338 can be formed adjacent to the second resist opening 210.

The second resist layer 208 can be formed in a number of different ways. For example, the second resist layer 208 can be formed by a process, such as chemical vapor deposition or a screen printing process.

Figure 7:
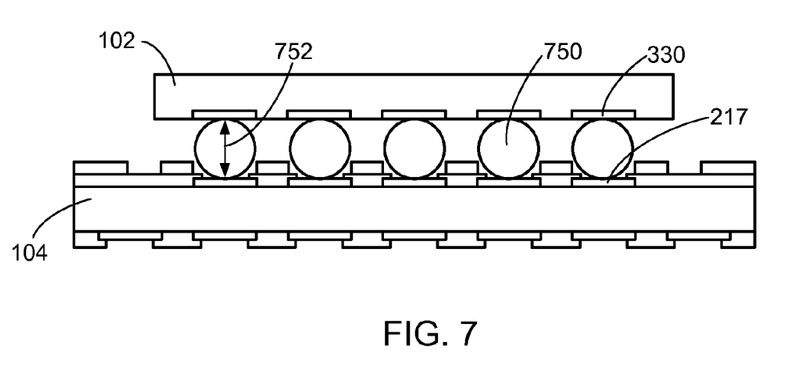
FIG. 7 is the structure of FIG. 6 in a mounting phase of the integrated circuit.

Referring now to FIG. 7, therein is shown the structure of FIG. 6 in a mounting phase of the integrated circuit 102. The integrated circuit 102 can be mounted over the carrier 104. The integrated circuit 102 can have the mounting pad 330 along the side of the integrated circuit 102 facing the carrier 104.

A preliminary interconnect 750, which is an electrical connector in a state prior to a reflow process, such as a solder ball, can connect the mounting pad 330 of the integrated circuit 102 with the contact pad 217 of the carrier 104. The preliminary interconnect 750 can have a preliminary diameter 752. As an example, the preliminary diameter 752 can be 89 micrometers or less.

The first opening dimension 216 of FIG. 5 and the first resist thickness 326 can be related to the preliminary diameter 752 of the preliminary interconnect 750 according to equation 7, as follows:

$$Y = 2\sqrt{(D/2)^2 - ((D/2)-X)^2} \qquad (7)$$

Where "Y" represents the first opening dimension 216, "X" represents the first resist thickness 326, and "D" represents the preliminary diameter 752.

Figure 8:
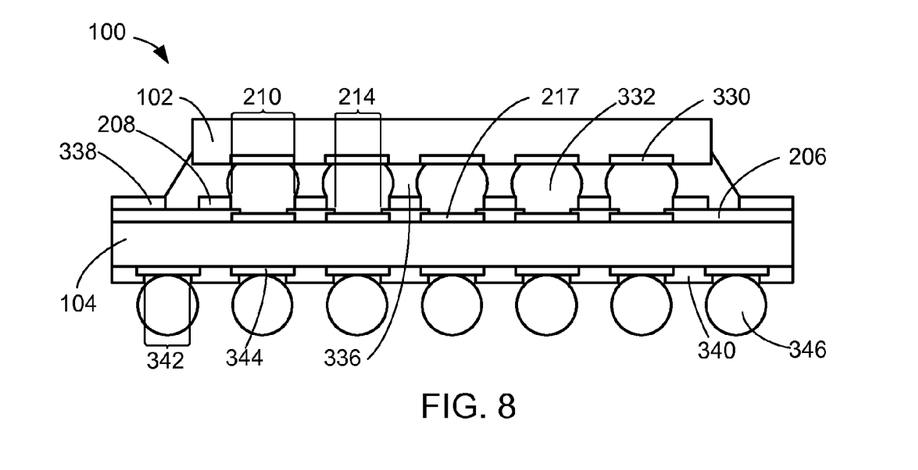
FIG. 8 is the structure of FIG. 7 in forming the integrated circuit packaging system.

Referring now to FIG. 8, therein is shown the structure of FIG. 7 in forming the integrated circuit packaging system 100. The internal interconnect 332 can be formed between the integrated circuit 102 and the carrier 104 by heating the preliminary interconnect 750 of FIG. 7 in a reflow process. The internal interconnect 332 can be formed from the preliminary interconnect 750 to cover the contact pad 217 and fill the first resist opening 214 of the first resist layer 206 and the second resist opening 210 of the second resist layer 208.

The internal interconnects 332 can conformally fill the second resist opening 210. Conformally fill means that there is no space or gap between the second resist layer 208 in the second resist opening 210 and the internal interconnects 332.

The underfill 336 can be formed between the integrated circuit 102 and the carrier 104. The underfill 336 can be formed around the internal interconnect 332 and over the second resist layer 208. The underfill 336 can be bound along the second resist layer 208 by the dam 338.

The external interconnect 346 can be connected to the external connect pad 344. The external interconnect 346 can be in the third resist opening 342 of the third resist layer 340.

Figure 9:
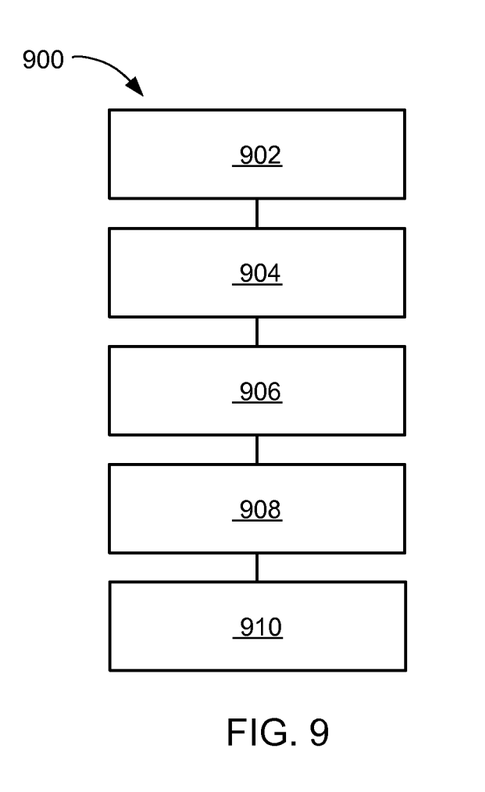
FIG. 9 is a flow chart of a method of manufacture of an integrated circuit packaging system in an embodiment of the present invention.

Referring now to FIG. 9, therein is shown a flow chart of a method 900 of manufacture of an integrated circuit packaging system in an embodiment of the present invention. The method 900 includes: providing a carrier having a contact pad in a block 902; forming a first resist layer, having a first resist opening, over the carrier and the contact pad, the first resist opening partially exposing the first contact pad in a block 904; forming a second resist layer, having a second resist opening over the first resist opening, the second resist opening partially exposing the first resist layer in a block 906; mounting an integrated circuit over the carrier in a block 908; and forming an internal interconnect between the integrated circuit and the carrier, the internal interconnect filling the second resist opening with no space between the second resist layer in the second resist opening in a block 910.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description.

Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
providing a carrier having a contact pad with a contact width;
forming a first resist layer, having a first resist opening, over the carrier and the contact pad, the first resist opening partially exposing the contact pad, the first resist opening less than the contact width;
forming a second resist layer, having a second resist opening over the first resist opening, the second resist opening exposing the first resist layer and forming a horizontal step between the second resist layer and the first resist layer, the second resist opening greater than the first resist opening and substantially equivalent to the contact width;
mounting an integrated circuit over the carrier; and
forming an internal interconnect between the integrated circuit and the carrier, the internal interconnect filling the first resist opening and the second resist opening with no space between the second resist layer in the second resist opening.

2. The method as claimed in claim 1 wherein:
forming the first resist layer includes forming the first resist layer having a first resist thickness; and
forming the second resist layer includes forming the second resist layer having a second resist thickness equivalent to the first resist thickness.

3. The method as claimed in claim 1 further comprising forming an underfill between the integrated circuit and the carrier without contacting the first resist layer.

4. The method as claimed in claim 1 wherein forming the internal interconnect includes forming a bulge over a portion of the second resist layer adjacent to the second resist opening.

5. The method as claimed in claim 1 wherein:
forming the internal interconnect includes forming the internal interconnect from a preliminary interconnect having a preliminary diameter; and
forming the first resist layer includes:
forming the first resist layer having a first resist thickness, and
forming the first resist opening having a first opening dimension related to the preliminary diameter and the first resist thickness according to the equation:

$$Y = 2\sqrt{(D/2)^2 - ((D/2) - X)^2} + 20$$

where "Y" represents the first opening dimension, "X" represents the first resist thickness, and "D" represents the preliminary diameter.

6. A method of manufacture of an integrated circuit packaging system comprising:
providing a carrier, having a carrier first side and a carrier second side, with a contact pad along the carrier first side, the contact pad having a contact width;
forming a first resist layer, having a first resist opening, over the carrier first side and the contact pad, the first resist opening partially exposing the contact pad, the first resist opening less than the contact width;
forming a second resist layer, having a second resist opening over the first resist opening, the second resist opening exposing the first resist layer and forming a horizontal step between the second resist layer and the first resist layer, the second resist opening greater than the first resist opening and substantially equivalent to the contact width;
mounting an integrated circuit over the carrier first side; and
forming an internal interconnect between the integrated circuit and the carrier, the internal interconnect filling the first resist opening and the second resist opening with no space between the second resist layer in the second resist opening.

7. The method as claimed in claim 6 further comprising forming a third resist layer, having a third resist opening, over the carrier second side.

8. The method as claimed in claim 6 wherein:
forming the first resist layer includes forming the first resist opening having a circular geometric shape; and
forming the second resist layer includes forming the second resist opening having a circular geometric shape and concentric with the first resist opening.

9. The method as claimed in claim 6 wherein forming the internal interconnect includes forming the internal interconnect filling the first resist opening with no space between the first resist layer in the first resist opening.

10. The method as claimed in claim 6 wherein:
mounting the integrated circuit includes mounting the integrated circuit having a mounting pad along a side of the integrated circuit facing the carrier; and
forming the internal interconnect includes connecting the internal interconnect between the mounting pad and the contact pad.

11. An integrated circuit packaging system comprising:
a carrier having a contact pad with a contact width;
a first resist layer, having a first resist opening, over the carrier and the contact pad, the first resist opening partially exposing the contact pad, the first resist opening less than the contact width;
a second resist layer, having a second resist opening, over the first resist layer, the second resist opening exposing the first resist layer and forming a horizontal step between the second resist layer and the first resist layer, the second resist opening greater than the first resist opening and substantially equivalent to the contact width;
an integrated circuit mounted over the carrier; and
an internal interconnect between the integrated circuit and the carrier, the internal interconnect filling the first resist opening and the second resist opening with no space between the second resist layer in the second resist opening.

12. The system as claimed in claim 11 wherein:
the first resist layer has a first resist thickness; and
the second resist layer has a second resist thickness equivalent to the first resist thickness.

13. The system as claimed in claim 11 further comprising an underfill formed between the integrated circuit and the carrier without contacting the first resist layer.

14. The system as claimed in claim 11 wherein the internal interconnect includes a bulge over a portion of the second resist layer adjacent to the second resist opening.

15. The system as claimed in claim 11 further comprising a dam adjacent to the second resist opening.

16. The system as claimed in claim 11 wherein:
the carrier includes a carrier first side and a carrier second side with the contact pad along the carrier first side;
the first resist layer is over the carrier first side; and
the integrated circuit is mounted over the carrier first side.

17. The system as claimed in claim 16 further comprising a third resist layer, having a third resist opening, over the carrier second side.

18. The system as claimed in claim 16 wherein:
    the first resist opening has a circular geometric shape; and
    the second resist opening has a circular geometric shape and is concentric with the first resist opening.

19. The system as claimed in claim 16 wherein the internal interconnect fills the first resist opening with no space between the first resist layer in the first resist opening.

20. The system as claimed in claim 16 wherein:
    the integrated circuit includes a mounting pad along a side of the integrated circuit facing the carrier; and
    the internal interconnect is connected between the mounting pad and the contact pad.

* * * * *